United States Patent [19]

Duckeck et al.

[11] Patent Number: 5,493,709
[45] Date of Patent: Feb. 20, 1996

[54] RADIO RECEIVER FOR RECEIVING DIGITALLY CODED INFORMATION INCLUDING LOCATION AND FREQUENCY DATA OF A TRANSMITTER

[75] Inventors: Ralf Duckeck; Gunter Luber; Peter Braegas, all of Hildesheim; Rudolf Messerschmitt, Sibbesse, all of Germany

[73] Assignee: Robert Bosch GmbH, Stutgart, Germany

[21] Appl. No.: 131,510

[22] Filed: Oct. 4, 1993

[30] Foreign Application Priority Data

Oct. 2, 1992 [DE] Germany .......................... 42 33 210.9

[51] Int. Cl.$^6$ ...................................... H04B 1/18
[52] U.S. Cl. .................... 455/185.1; 455/161.2; 455/161.3; 455/186.1
[58] Field of Search .................... 455/38.2, 38.4, 455/45, 185.1, 186.1, 186.2, 345, 32.1, 34.1, 33.1, 161.1, 161.2, 161.3; 340/905

[56] References Cited

U.S. PATENT DOCUMENTS

| 5,095,532 | 3/1992 | Mardus | 455/186 |
|---|---|---|---|
| 5,208,756 | 5/1993 | Song | 364/449 |
| 5,293,642 | 3/1994 | Lo | 455/33.1 |
| 5,303,401 | 4/1994 | Duckeck et al. | 455/186.1 |
| 5,345,606 | 9/1994 | Duckeck et al. | 455/186.1 |
| 5,355,526 | 10/1994 | Berninger | 455/161.2 |

FOREIGN PATENT DOCUMENTS

| 0446985 | 9/1991 | European Pat. Off. . | |
|---|---|---|---|
| 0476826 | 3/1992 | European Pat. Off. | 455/186.1 |
| 3439264 | 4/1986 | Germany . | |
| 3810180 | 10/1989 | Germany . | |
| 3214155 | 11/1989 | Germany . | |
| 3914104 | 11/1990 | Germany . | |
| 3936577 | 5/1991 | Germany . | |
| 2240677 | 8/1991 | United Kingdom . | |

OTHER PUBLICATIONS

Individuelle Verkehrsleittechnik, Von Wolf Zechnall, Bosch Technische Berichte, 1991, Heft 54, pp. 10–16.
Bosch Technical Reports, [Bosch Technische Berichte], vol. 8, issue 1/2, pp. 15 through 25, The Transmission of Coded Traffic Information via UKW Radio Transmitters by Means of RDS by Peter Bragas.
Franz Stollenwerk, RDS—A New Service in UKW Broadcasting, in the trade magazine ntz, vol. 40 (1987), vol. 5, pp. 346–351.
Specifications of the Radio Data System RDS for VHF/FM Sound Broadcasting, European Union 1984, pp. 11, 12.
Cenelec En 50067 in (RDS) SPB 482, p. 4.

Primary Examiner—Edward F. Urban
Assistant Examiner—Lee Nguyen
Attorney, Agent, or Firm—Kenyon & Kenyon

[57] ABSTRACT

A radio receiver selects incoming traffic messages with respect to their validity for the approximate location of the radio receiver and includes a decoder. The radio receiver uses frequency data and coordinate data transmitted by the transmitters to determine its approximate location, and compares this approximate location to locations contained in the traffic messages. When there is conformity, a conformity signal serves to switch through the location-specific messages contained in the traffic messages to an audio output device.

6 Claims, 5 Drawing Sheets

| 90 MHz | 400 | 372 |
| --- | --- | --- |
| 90 MHz | 300 | 268 |
| .... | .... | .... |
| .... | .... | .... |

FIG. 4

| DANGER: DRIVER DRIVING IN THE WRONG DIRECTION |
| --- |

| HIGHWAY A8 |
| --- |
| AUGSBURG |
| ULM |

| 90 MHz | 400 | 372 |
| --- | --- | --- |
| 90 MHz | 300 | 268 |

FIG. 5

| AUGSBURG, ULM | DILLINGEN, KRUMBACH, GÜNZBURG |
|---|---|
| AUGSBURG, GÜNZBURG | KRUMBACH, DILLINGEN |
| ⋮ | ⋮ |
| MÜNCHEN, LINDAU | WANGEN, MEMMINGEN.... |
| ⋮ | ⋮ |

RADIO RECEIVER FOR RECEIVING DIGITALLY CODED INFORMATION INCLUDING LOCATION AND FREQUENCY DATA OF A TRANSMITTER

BACKGROUND OF THE INVENTION

The present invention is related to a radio receiver, and in particular to an automobile receiver having a decoder for decoding received digitally coded information transmissions, and more particularly to information transmitted in accordance with an RDS (Radio Data System) System.

German Unexamined Patent Application No. 38 10 180 (incorporate, herein by reference) describes a radio receiver in which digital information, in particular information transmitted according to an RDS, is selectively switched through to an audio output device by an operator (e.g., a driver) through the setpoint input of identifiers. Such an arrangement disadvantageously distracts the driver from current traffic conditions. Further, information regarding the allocation of the identifiers to the geographic location and information regarding the actual location of the radio receiver are required.

German Patent No. 32 14 155 (incorporated herein by reference) describes a radio receiver which selects received messages based on the quality of the transmissions being received and based on a table of transmitter-location coordinates permanently stored in the radio unit. However, with such an arrangement, if the stored data changes with respect to frequency, transmitter identifier, or location, then the information held in the storage device is no longer up-to-date. Further, if as a means of assistance, a transmitter broadcasts the program of another transmitter chain (i.e., relay reception), then the position of the original transmitter may be incorrectly determined.

Moreover, *Bosch Technical Reports*[Bosch Technische Berichte], volume 8, issue ½, pp. 15 through 25, *The Transmission of Coded Traffic Information via UKW Radio Transmitters By Means of RDS* by Peter Brägas, Fritz Busch, and Claus Mardus (incorporated herein by reference), describes an RDS which transmits standardized texts of traffic messages as coded messages. In such a system, the decoding of the traffic messages and conversion into voice signals takes place directly in the radio receiver.

An RDS Traffic Radio-Communication System is described by the article by Franz Stollenwerk, *RDS - A New Service in UKW Broadcasting*, in the trade magazine ntz, volume 40 (1987), volume 5, pp. 346–351 (incorporated herein by reference). In such an arrangement, the RDS signal is broadcasted together with the broadcasting program and received via an antenna. The RDS signal is initially demodulated in the receiver by a VHF demodulator and is then biphase- and differential-decoded by the subsequent decoder. This demodulation recovers bit-timing and data signals. The data format of the RDS signal of such a system consists of groups, each group containing four blocks. Each block includes a 16-bit word and a 10-bit check word. The brochure, *Specifications of the Radio Data System RDS for VHF/FM Sound Broadcasting*, European Broadcasting Union 1984, pp. 11, 12 (incorporated herein by reference) specifies the data format for RDS signals. The application of an RDS signal for transmitting information by means of TMC (i.e., Traffic Message Channel) is described in the specification *CENELEC EN 50067 in (RDS) SPB* 482, p. 4 (incorporated herein by reference). In that system, a data channel is available for TMC identification in the RDS group 1A, block 3.

In the above systems, a car driver must manually select an RDS. Further, changes in transmitter location, frequency, or identification or relayed reception lead to incorrect determination of the original RDS transmitter. Thus, there is a need for an RDS system in which traffic data is automatically selected and in which the original RDS transmitter can be correctly identified.

SUMMARY OF THE INVENTION

The radio receiver of the present invention advantageously uses current frequency and coordinate data, transmitted by the transmitter itself, as a basis for selecting traffic messages.

As a result, traffic data are automatically selected without requiring operator (e.g., driver) input and the driver is not distracted from current traffic conditions. Further, the driver can provide an input to the radio receiver without knowing the geographical locations of the transmitters or their coding. Further, faulty position finding is eliminated even when there is a relay-reception operation.

By storing the transmitted frequency data and coordinate data in a storage device upon receipt of a frequency-data and coordinate-data set, the device of the present invention advantageously provides complete information pertaining to the entire transmitter chain within the radio receiver for further processing. Further, such stored data can be retrieved. Furthermore, when selecting messages pertinent to only a particular location, the device of the present invention advantageously compares the stored frequency data to the frequency tuned to the radio receiver and utilizes the comparison result as a selection criterion. In this manner, only relevant, location-specific messages are meaningfully selected.

By evaluating frequency data and coordinate data from several transmitters of one transmitter chain, the device of the present invention advantageously improves the determination of the approximate location of the radio receiver.

By processing all acquired location data into an average value, the device of the present invention is able to specify the approximate location of the radio receiver in a simple manner.

By limiting the switching-through of the location-specific messages to only those pertinent to the determined, approximate location of the radio receiver, the present invention advantageously prevents the user of the radio receiver from receiving inconsequent location-specific messages.

By expanding the validity range of the location-specific messages transmitted by the transmitter, validity ranges which are not transmitted by the transmitter, but which are affected by the location-specific messages, are considered by the device of the present invention. As a result, the message selection is not too restrictive.

In addition, when receiving coded, transmitted information, the radio receiver of the present invention can utilize and support the coding advantageously since it includes a code/speech converter integrated in the radio unit. The code/speech convertor permits traffic messages to be output in any language.

BRIEF DESCRIPTION OF THE DRAWINGS

FIG. 4 is a schematic depiction of the contents of the storage device of the present invention.

FIG. 5 is a schematic representation of the contents of transmitted traffic messages according to the present invention.

FIG. 6 is a schematic representation of the contents of the data storage unit of the present invention.

DETAILED DESCRIPTION

Figure 1:
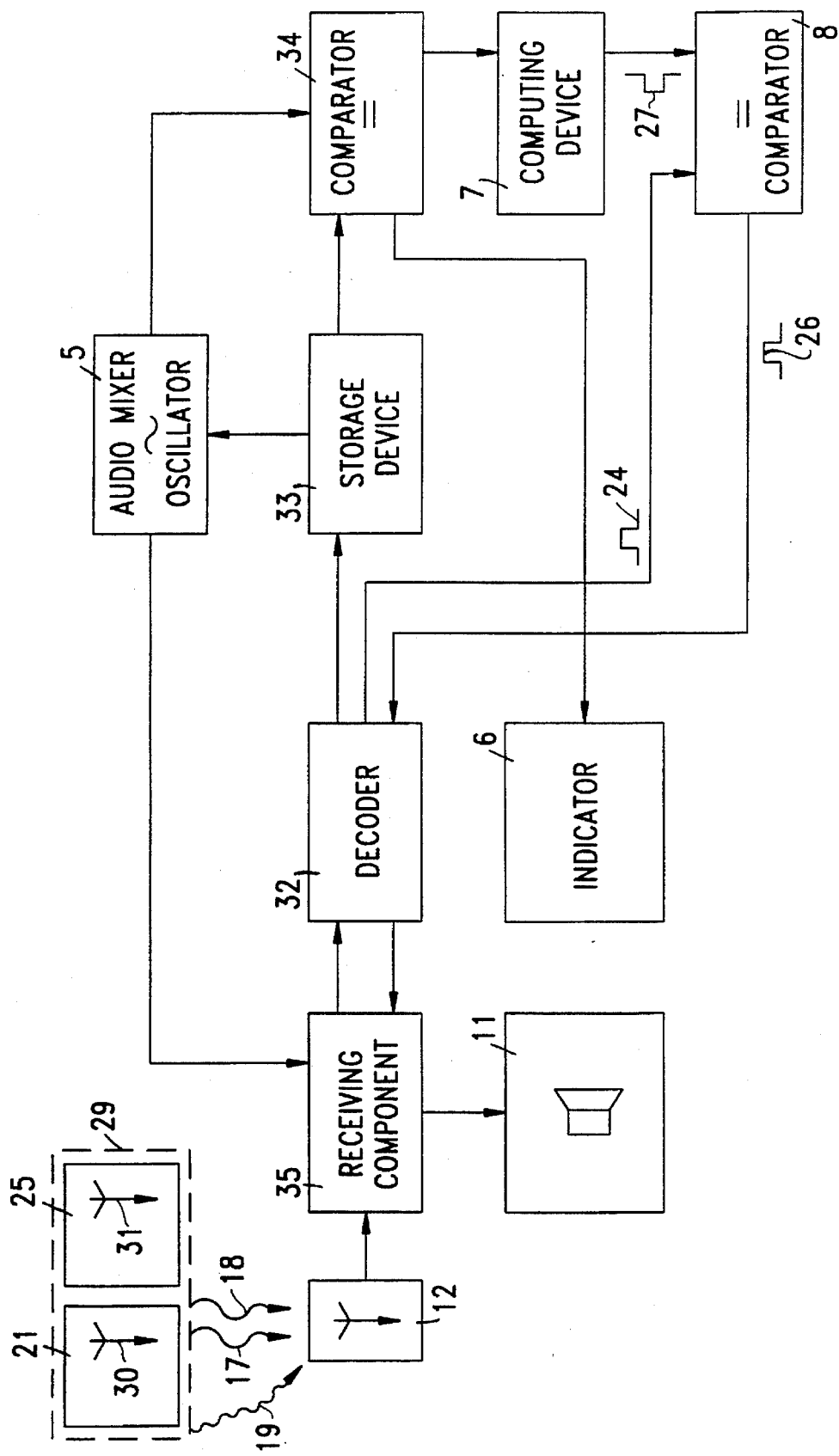
FIG. 1 is a block diagram of the radio receiver of the present invention.

FIG. 1 is a block diagram of a radio receiver in accordance with the present invention.

An antenna 12 relays received signals to a first input of a receiving component 35. A loudspeaker 11 is coupled with an output of the receiving component 35. A tuner 5 is coupled with a second input of the receiving component 35 and is also coupled with a first input of a comparator 34. Output signals from the receiving component 35 are provided to a first input of a decoder 32. An output from the decoder 32 is then provided to a storage device 33 as well as to a first input of a comparator 8. A first output of the storage device 33 is coupled with an input of the tuner 5. A second output of the storage device 33 is coupled with a second input of the comparator 34. The input of indicator 6 is coupled with an output of the comparator 34. A computing device 7 is coupled with an output of the comparator 34. The output of the computing device 7 is coupled with a second input of the comparator 8. The output of the comparator 8 is coupled with a second input of the decoder 32. An output of the decoder 32 is coupled with a third input of the receiving component 35.

A transmitter chain 29 includes a first transmitter 30 having a location 21 and second transmitter 31 having a location 25. The transmitter 30 transmits: location-specific messages 19; information 17, which contains the frequencies and the location coordinates of the transmitters 30, 31; and additional information 18 containing descriptions of the validity ranges of the location-specific messages 19.

The transmitted information 17, 18 and the location-specific messages 19 are received by the antenna 12. The information 17 is relayed by the receiving component 35 to the decoder 32. The decoder 32 decodes the frequency data and coordinate data from the transmitters 30, 31 of the transmitter chain 29 contained therein. The decoded information in the decoder 32 is then relayed to the storage device 33 where it is stored. The frequency at which the tuner 5 is then adjusted is supplied to the first input of the comparator 34 while the decoded frequency data of transmitter 30 stored in storage device 33 is supplied to the second input of comparator 34. The comparator 34 checks the two frequencies for conformity. If conformity exists, the location coordinates of the transmitter 30 being received are routed to the computing device 7. Further, the storage device 33 then relays the frequency data of any further transmitters in the transmitter chain 29 (i.e., the transmitter 31) to the tuner 5. The tuner 5 then automatically adjusts itself to the relayed frequency. The tuner 5 then checks the relayed frequency for receivability (i.e., it is determined whether a signal is received when tuner 5 is adjusted to the frequency of transmitter 31). When receivability is determined, the tuner 5 relays the frequency to the comparator 34, where this frequency is again compared to the frequency of the next set of information 17 stored in the storage device 33. If conformity is found in this case as well, the coordinate data corresponding to the frequency data are also relayed to the computing device 7 again. A conversion program (see FIG. 3) in the computing device 7 converts the received coordinate data into an average location value 27.

The additional information 18, which contains descriptions of the validity ranges of the location-specific messages 19, is relayed via the antenna 12 and the receiving component 35 to the decoder 32 and is decoded there. The decoder also allocates additional validity ranges to the already transmitted validity ranges (see FIG. 2). Thus, new information 24 regarding the expanded validity ranges of the location-specific messages 19 is created in the decoder 32. From the decoder 32, the new information 24 regarding the expanded validity ranges of the location-specific messages 19 is provided to a first input of the comparator 8. The comparator 8 then compares the new information to the average location value 27 supplied by the computing device 7 to a second input. If the average location value 27 is found to be within the expanded validity range, a conformity signal 26 from the comparator 8 is provided to a second input of the decoder 32. This signal is utilized by the decoder 32 to enable the location-specific messages 19 to be switched through to the receiving component 35. The location specific messages 19 are converted there to audio voice signals and are then provided to the loudspeaker 11 via the receiving component 35. In addition, the frequency data and coordinate data existing in the comparator 34 can be displayed on the indicator 6.

The functioning of the radio receiver of FIG. 1 shall be clarified in the following example.

A radio chain 29 designated as Southwest Radio (III) (SWF III) having a transmitter 30 with a transmitting frequency of 90 MHz and a location 21 of Stuttgart and having an additional transmitter 31 with a transmitting frequency of 95 MHz and a location 25 of Munich transmits traffic messages. The information 17 data contained therein comprises frequencies and location coordinates (i.e., f=90 MHz, X=400, Y=372 (Stuttgart); f= 95 MHz, X=300, Y=268 (Munich)). This data is provided to the storage device 33 via the antenna 12, the receiving component 35, and the decoder 32. The comparator 34 detects a conformity between the frequency 90 MHz presently tuned in at the tuner 5 and the storage contents of storage device 33, and therefore relays the coordinate data (400, 372) for the Stuttgart location to the computing device 7. The frequency 95 MHz is then relayed from the storage device 33 to the tuner 5. The tuner 5 then automatically adjusts itself to 95 MHz and checks whether a signal is received at this frequency. Assuming the radio receiver likewise receives the transmitter 31 in Munich, the coordinate data (300, 268), corresponding to the Munich transmitter, are also relayed by the comparator 34 to the computing device 7. The average value 27 between the coordinates from Munich and Stuttgart is then calculated by means of the conversion program (see FIG. 3) in the computing device 7. This average value 27(X=350,Y=320) corresponds more or less (i.e., approximately) to a location at Günzburg.

The traffic messages sent out by the transmitter 30 in Stuttgart contain messages about events on the highways A1, A3, and A8 as location-specific messages 19, as well as additional information 18 about the validity ranges of these messages, such as the validity ranges "Augsburg, Ulm" for a message about the occurrence of a driver driving in the wrong direction. The decoding and expansion of these validity ranges in the decoder 32 allocates the locations, "Dillingen, Krumbach, Gunzburg", adjacent to these locations (i.e., Augsburg and Ulm), as additional validity ranges to the previous validity ranges "Augsburg, Ulm".

The result is, inter alia, that the messages pertaining to Highway A8 in the Günzburg area are valid, corresponding to the fact that Highway A8 runs through Günzburg. The new information 24 about the expanded validity ranges, i.e., "Augsburg, Ulm, Krumbach, Dillingen, Gunzburg", is compared in the comparator 8 to the average value 27, which is supplied by the computing device 7 and is to be interpreted as the approximate location of the radio receiver. The conformity of the approximate Günzburg location calculated by the computing device 7 with the expanded validity ranges for the message about Highway A8 leads to a conformity signal 26, which attains the decoder 32 from the comparator 8. Thus, the radio receiver is determined to be situated in the area around Günzburg. As a consequence, the traffic information about Highway A8, which is relevant to drivers in the area around Günzburg, is made available for the driver to hear. The location-specific message 19 about Highway A8 is therefore released in the decoder 32 to be switched through, converted there into audio voice signals, and switched through via the receiving component 35 to the loudspeaker 11.

Figure 2:
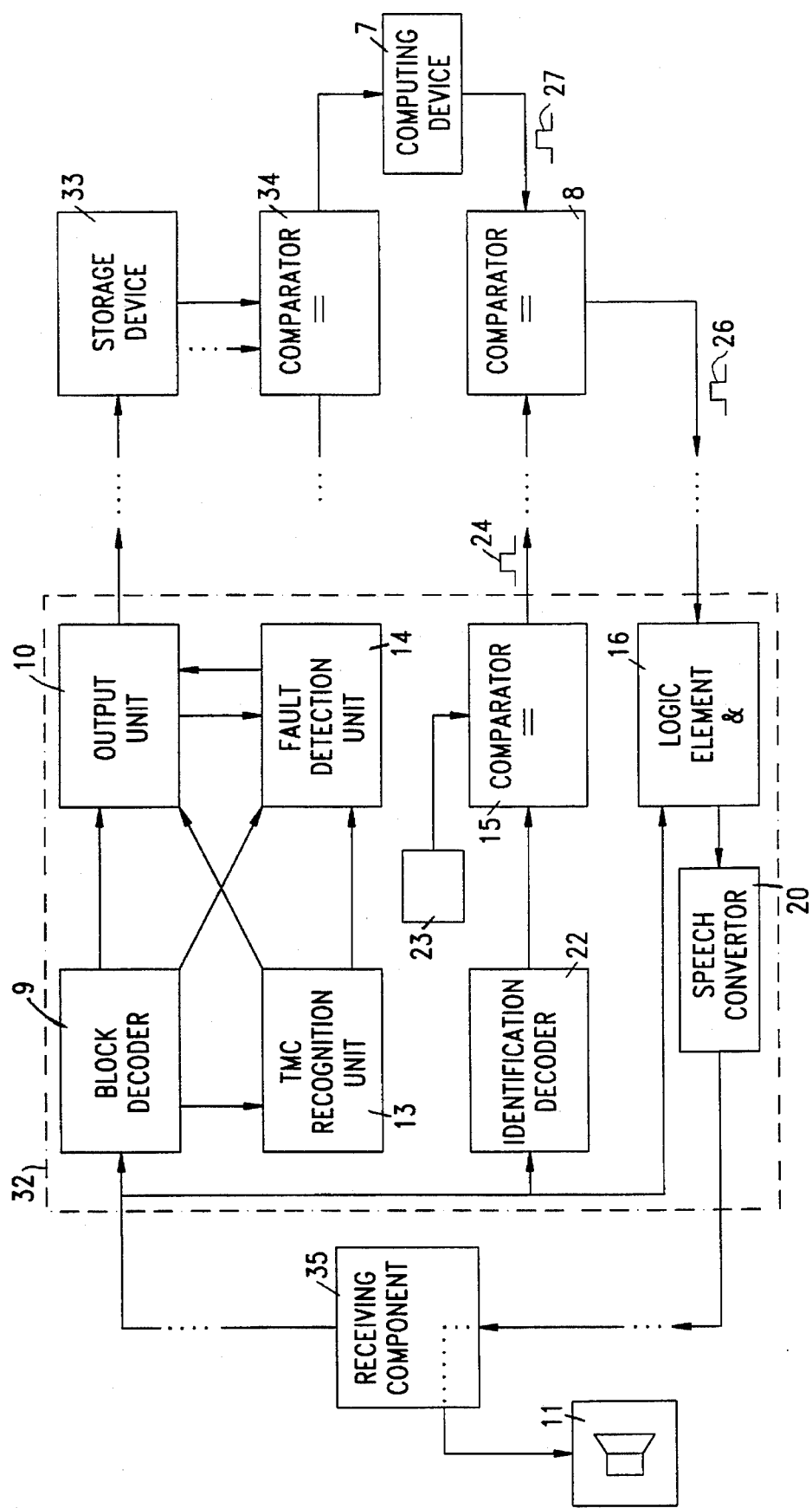
FIG. 2 is a block diagram of the decoder contained in the radio receiver of the present invention.

The structure of the decoder 32 is depicted in FIG. 2. Input signals from a receiving component 35 (as illustrated in FIG. 1), are provided to a block decoder 9. Output signals from the block decoder 9 serve as input signals for a TMC (Traffic Message Control) recognition unit 13, a fault detection unit 14, and an output unit 10. Similarly, outputs of the TMC recognition unit 13 and the output unit 10 are coupled with inputs of the error detection unit 14. Output signals from the TMC recognition unit 13 and from the error detection unit 14 are provided to inputs of the output unit 10. One output of the output 10 constitutes an output of the decoder 32 (as already described in the description of FIG. 1) and is coupled with an input of the storage device 33. The input signal of the decoder 32 from the receiving component 35 also is applied to an identification decoder 22. An input of a comparator 15 is coupled with an output of the identification decoder 22. The output of a data storage device 23 is coupled with a second input of the comparator 15. Lastly, the input signal of the decoder 32 from the receiving component 35 is coupled with an input of a logic element 16. The output of the comparator 15 constitutes a second output of the decoder 32 and leads to the first input of the comparator 8 (described with respect to FIG. 1). The output of the comparator 8 is coupled with a second input of the decoder 32 and in particular, to a second input of the logic element 16. The output of the logic element 16 is coupled with a speech converter 20. The output of the speech converter 20 constitutes a third output of the decoder 32 and is coupled with an input of the receiving component 35.

The block decoder 9 decodes the input signals provided at its input, checks them for transmission errors, and corrects them if necessary. The correct data are then provided at a first output of the block decoder 9. The corrected data are also provided at the input of the TMC recognition unit 13. The TMC recognition unit 13 detects the occurrence of TMC data and feeds this TMC data to a first input of the output unit 10. Given a correct transmission, which is recognized by the error detection unit 14 by checking the data with the help of output signals from the TMC recognition 13, from the block decoder 9, and from the output 10, the TMC data being applied to the first input of the output unit 10 are filed in the output unit 10 and output at the output unit 10 are coupled with the storage device 33.

The input signal of the decoder 32 (e.g., the traffic messages) is also provided at an input of the identification decoder 22. This identification decoder 22 decodes the additional information 18 contained in the traffic messages and transmits the decoded additional information to the comparator 15. The comparator 15 compares the data from the identification decoder 22 with the information filed in the data storage device 23, which allocates the other validity ranges (see FIG. 6) to the validity range contained in the other information 18. If conformity exists, the other comparator 15 relays new information 24 regarding the expanded validity ranges of the location-specific messages 19 to the comparator 8. If conformity exists between a validity range and the approximate location of the radio receiver supplied by the computing device 7, the result of the comparison in the comparator 8 is a conformity signal 26, which is provided to an input of the logic element switch 16. The conformity signal 26 allows the traffic messages to be switched through via the logic element 16 to the speech converter 20.

In the speech converter 20, the coded traffic messages are decoded and converted into voice signals. These signals are then provided to the receiving component 35.

Figure 3:
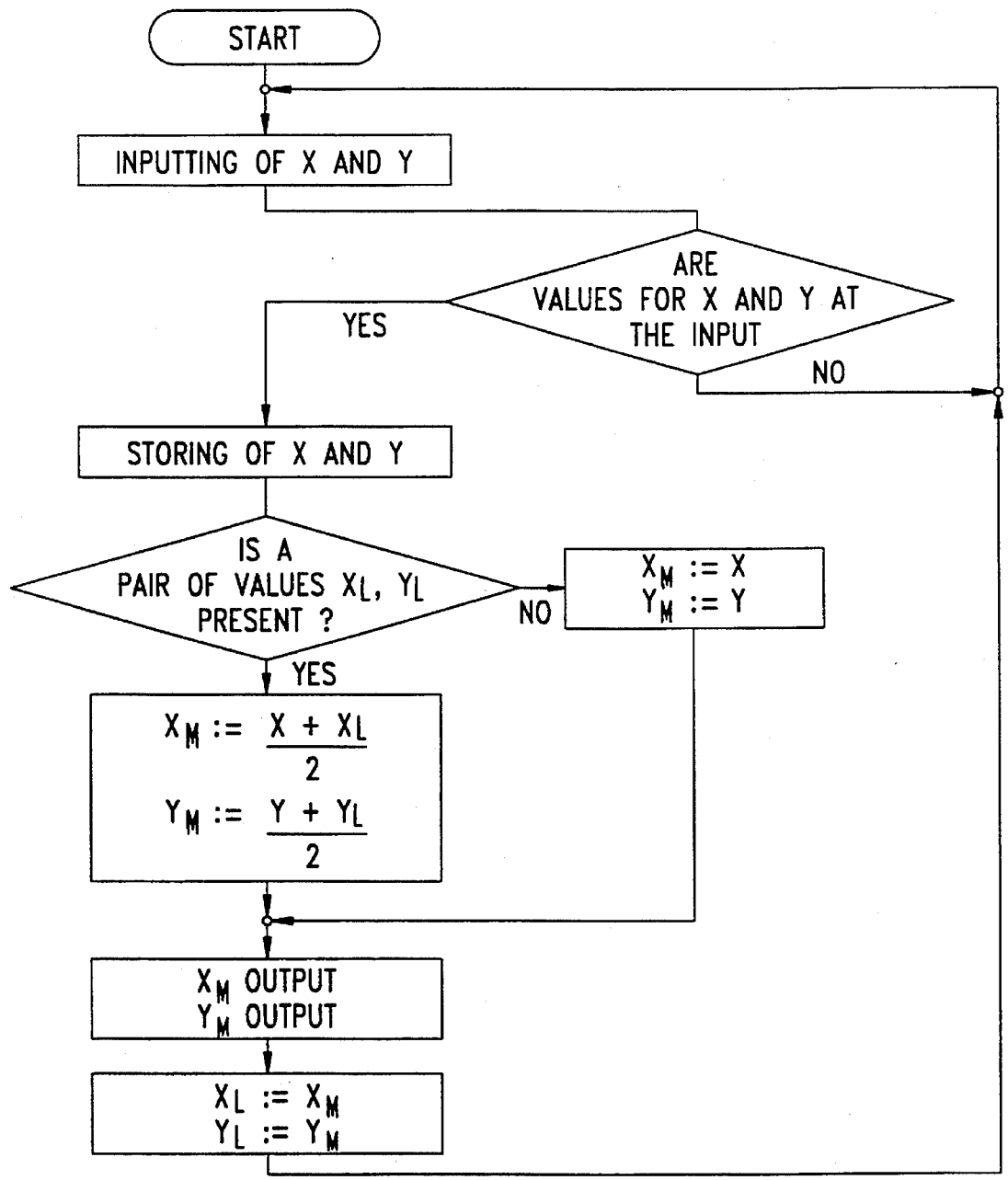
FIG. 3 is a flow chart of a conversion program for generating mean values.

FIG. 3 depicts a flow chart illustrating the procedure used by the computing device 7 for determining an average location value. When the radio receiver powered, program execution is initiated. The computing device 7 constantly polls the comparator 34 for X and Y coordinate data for one of the locations 21, 25 of one of the transmitters 30, 31. The incoming values X, Y are stored and are processed with any pre-existing pair of values $X_L$, $Y_L$ to form an average value 27 having the coordinates $X_M$, $Y_M$. This average value 27 is then provided at the output of the computing device 7 as an approximate location value for further processing, and also serves as a new pair of values $X_L$, $Y_L$ to be compared with new incoming value of X, Y. If a pair of preexisting values $X_L$, $Y_L$ are not yet available in the computing device 7, the coordinate data X, Y themselves serve as an average value 27.

The conversion program in the computing device 7 can also utilize other algorithms, which, for example, also include: the range of the transmitters 30, 31 from the stored tables, or after the strength of the receiving field is determined, including this range in the position finding.

Furthermore, adjusting frequencies from transmitters 30, 31 of several transmitter chains 29 at the tuner 5, and evaluating the received data is also possible.

FIG. 4 is a schematic representation of the contents of the storage device 33. The incoming decoded data is grouped together, each group comprising one frequency and corresponding X and Y coordinate values.

FIG. 5 schematically depicts the contents of a traffic message. Here, the traffic message states, for example "danger: driver driving in the wrong direction on Highway A8 between Augsburg and Ulm". This traffic information is transmitted as digitally coded information and is decoded in the radio receiver. The text section "danger: driver driving in the wrong direction" corresponds to the location-specific message 19. The text section "Highway A8, Augsburg and Ulm" corresponds to the other information 18. The application of a standardized message text and its coding permits an especially simple allocation principle of additional validity ranges to the transmitted validity ranges, which are contained in the other information 18. In addition, the traffic messages also include a text portion including the frequency and coordinate data corresponding to information 17.

FIG. 6 depicts the schematic grouping of the contents of the data storage device 23. The groups included therein include a combination of validity ranges (for example Augsburg, Ulm) and other validity ranges (for example Dillingen, Krumbach, Günzburg) to be allocated to these validity ranges. The total contents of one group filed in the data storage device 23 constitute the expanded validity ranges (in this case: Augsburg, Ulm, Dillingen, Krumbach, Günzburg), which serve as a comparison to the determined approximate location of the radio receiver.

The specification CENELEC EN 50067 in (RDS) SPB 482 describes the presence of a data channel for TMC identification in the RDS group 1A, block 3. There, 12 bits are available. Therefore, it is particularly useful to utilize these 12 bits to identify the transmitter locations 30, 31, in that the frequency and coordinate data are filed in these 12 bits and transmitted.

What is claimed is:

1. A radio receiver for receiving digitally coded information transmitted by a transmitter, the digitally coded information including location and frequency data of the transmitter, validity range data, and location-specific data, comprising:
   a) a decoder for decoding the digitally coded information including the frequency and the location data of the transmitter to produce decoded information including decoded frequency and location data;
   b) a switch selectively switching through the location-specific data based on at least one of the decoded frequency and location data:
   c) a storage device having an input provided with an output from the decoder, wherein the transmitter is part of a transmitter chain including at least one other transmitter and wherein the digitally coded information includes frequencies of said at least one other transmitter of said transmitter chain and locations of said at least one other transmitter of said transmitter chain and wherein the decoded information of said frequency and said location of said transmitter and of said frequencies and said locations of said at least one other transmitter are stored in said storage device;
   d) a tuner for adjusting said radio receiver to a particular frequency; and
   e) a comparator for comparing the particular frequency adjusted on said tuner with said frequency of said transmitter stored in said storage device,
   wherein, when conformity exists between the frequency presently adjusted to said tuner and said frequency stored in said storage device, said switch switches through location-specific messages corresponding to the location data of the transmitter whose frequency is adjusted to,
   wherein at least one of said frequencies of said at least one other transmitter of said transmitter chain stored in said storage device is automatically adjusted to by said tuner,
   wherein a receivability of the transmitter corresponding to said at least one frequency is checked by said tuner,
   wherein, when receivability exists, a location corresponding to said at least one frequency is read out of said storage device, and
   wherein based on the location of the transmitter and based on the location corresponding to said at least one frequency, the location of the radio receiver is approximated.

2. The radio receiver according to claim 1, further comprising:
   f) a computing device for determining the approximate location of the radio receiver by averaging said location of said transmitter and said location corresponding to said at least one frequency.

3. The radio receiver according to claim 2, wherein the approximate location of the radio receiver is compared with additional information of the digitally coded information transmitted by the transmitter including the validity range data of the location-specific data such that said switch only switches through those location-specific data having a validity range which includes the approximate location of the radio receiver.

4. The radio receiver according to claim 3, wherein the approximate location of the radio receiver is compared to adjacent validity ranges of the validity ranges of the location-specific messages based on a table stored in the radio receiver, and wherein said switch only switches through messages having adjacent validity ranges that include the approximate location of the radio receiver.

5. In a radio receiver for receiving transmitted information including transmitter frequency and location data, a location-specific message, and a validity range, a method for selectively switching through the location-specific messages to a speaker, comprising the steps of:
   a) decoding said transmitter frequency and location data;
   b) storing said data decoded in step (a);
   c) determining the frequency at which a tuner of said radio is adjusted;
   d) comparing the frequency determined in step (c) with the frequency data stored in step (b);
   e) computing an approximate location of said radio receiver based on said location data stored in step (b) when a conformity is determined in the comparison of step (d);
   f) determining whether said approximate location computed in step (e) is within the transmitted validity range; and
   g) switching through said location-specific message to the speaker when said approximate location computed in step (e) is determined to be within a validity range of the location-specific message in step (f).

6. A mobile radio receiver comprising:
   a) an antenna for receiving transmitted data including location and frequency of a transmitter, validity ranges, and location-specific messages;
   b) a decoder coupled with said antenna, the decoder for decoding said transmitted data received by said antenna;
   c) a storage device coupled with said decoder, the storage device for storing said data decoded by said decoder;
   d) a tuner coupled with said storage device, the tuner for determining a frequency to which it is adjusted and for adjusting the radio receiver to a frequency of the frequency data stored in said storage device to determine receivability of the frequency;
   e) a comparator coupled with said storage device, the comparator for determining whether conformity exists between said stored frequency data and at least one of the frequency to which the tuner is presently adjusted and the frequency which is receivable as determined by the tuner;

f) a computing device coupled with said comparator, the computing device for calculating an approximate location of said radio receiver when said comparator determines the existence of conformity;
g) a second comparator coupled with said computing device, the second comparator for determining whether said approximate location of said radio receiver is within said validity range data; and
h) a speaker, wherein the decoder includes a switch coupled with said second comparator and said speaker for switching through decoded location-specific data from said decoder to said speaker when said second comparator determines that said approximate location of said radio receiver is within said validity range data.

* * * * *